US012604440B2

(12) United States Patent
Hwang et al.

(10) Patent No.: US 12,604,440 B2
(45) Date of Patent: Apr. 14, 2026

(54) LOWER MODULE OF POWER ELECTRONIC DEVICE

(71) Applicant: LS ELECTRIC CO., LTD., Anyang-si (KR)

(72) Inventors: Soo Yong Hwang, Anyang-si (KR); Kil Ju Jung, Anyang-si (KR); Su Hyeong Lee, Anyang-si (KR); Won Suk Choi, Anyang-si (KR); Kyu Hwa Kim, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 230 days.

(21) Appl. No.: 18/272,155

(22) PCT Filed: Dec. 3, 2021

(86) PCT No.: PCT/KR2021/018194
§ 371 (c)(1),
(2) Date: Jul. 13, 2023

(87) PCT Pub. No.: WO2022/154260
PCT Pub. Date: Jul. 21, 2022

(65) Prior Publication Data
US 2024/0147677 A1 May 2, 2024

(30) Foreign Application Priority Data
Jan. 13, 2021 (KR) ........................ 10-2021-0004627

(51) Int. Cl.
*H05K 7/20* (2006.01)
*H02M 7/00* (2006.01)
(52) U.S. Cl.
CPC ........ *H05K 7/20909* (2013.01); *H02M 7/003* (2013.01); *H05K 7/209* (2013.01)

(58) Field of Classification Search
None
See application file for complete search history.

(56) References Cited

U.S. PATENT DOCUMENTS 5,091,823 A * 2/1992 Kanbara .............. H05K 9/0022
361/736
10,368,993 B2 * 8/2019 Henderson .............. A61L 27/18
(Continued)

FOREIGN PATENT DOCUMENTS

CN 102404979 A 4/2012
CN 102751885 A 10/2012
(Continued)

OTHER PUBLICATIONS

International Search Report for related International Application No. PCT/KR2021/018194; action dated Jul. 21, 2022; (2 pages).
(Continued)

*Primary Examiner* — Courtney L Smith
(74) *Attorney, Agent, or Firm* — K&L Gates LLP

(57) ABSTRACT

A lower module of a power electronic device includes a lower module included in a power electronic device that is divided into an upper module and a lower module by an intermediate plate and comprises a blower fan to introduce air into the inner space of the lower module; a plurality of capacitors installed in a suspended form on the intermediate plate and spaced apart from the blower fan; a heat sink having a plurality of heat dissipation fins through which heat generated from a heating component disposed on the upper module is conducted, and disposed adjacent to the capacitors to cool the plurality of heat dissipation fins by air moved from the plurality of capacitors; a DC reactor cooled by the air moved from the heat dissipation fins; and a discharge plate having a vent hole to discharge the air moved from the DC reactor to the outside.

11 Claims, 8 Drawing Sheets

10

(56)  References Cited

U.S. PATENT DOCUMENTS

| | | | | |
|---|---|---|---|---|
| 2002/0064028 A1* | 5/2002 | Nielsen | ............. | H05K 7/20918 |
| | | | | 361/689 |
| 2012/0063089 A1* | 3/2012 | Kishimoto | ........ | H05K 7/20909 |
| | | | | 361/697 |
| 2012/0262969 A1 | 10/2012 | Nagano et al. | | |
| 2016/0037677 A1* | 2/2016 | Yamanaka | ........ | H05K 7/20918 |
| | | | | 361/697 |
| 2020/0367390 A1* | 11/2020 | Takahashi | .......... | H05K 7/20909 |

FOREIGN PATENT DOCUMENTS

| | | | |
|---|---|---|---|
| CN | 202798488 U | 3/2013 | |
| CN | 106256176 A | 12/2016 | |
| JP | 2005348533 A | 12/2005 | |
| JP | 2012228019 A | 11/2012 | |
| JP | 2017131103 A | 7/2017 | |
| KR | 20120072945 A | 7/2012 | |
| KR | 20140142049 A | 12/2014 | |
| KR | 20150017080 A | 2/2015 | |

OTHER PUBLICATIONS

Written Opinion for related International Application No. PCT/KR2021/018194; action dated Jul. 21, 2022; (4 pages).
Office Action for related Chinese Application No. 202180082385.9; action dated May 29, 2025; (7 pages).
Office Action for related Chinese Application No. 202180082385.9; action dated Nov. 1, 2025; (8 pages).

* cited by examiner

70 : 71, 72

30

LOWER MODULE OF POWER ELECTRONIC DEVICE

CROSS-REFERENCE TO RELATED APPLICATIONS

This application is the National Stage filing under 35 U.S.C. 371 of International Application No. PCT/KR2021/018194, filed on Dec. 3, 2021 which claims priority to and the benefit of Korean Patent Application No. 10-2021-0004627, filed on Jan. 13, 2021, the disclosure of which is incorporated herein by reference in its entirety.

FIELD

The present disclosure relates to a lower module of a power electronic device, and more particularly, to a lower module included in a power electronic device divided into an upper module and a lower module by an intermediate plate.

BACKGROUND

An industrial power electronic device has a plurality of heating components and has a structure for effectively dissipating heat emitted from the heating components.

Among industrial power electronic devices, for example, in the case of an inverter device, the inverter device has a structure divided into an upper module and a lower module, and each module has a unique system for dissipating heat.

Specifically, in the case of the upper module, as shown in FIG. 1, a natural cooling system is formed to naturally introduce outside air through a plurality of vent holes provided in an outer housing, and then dissipate the outside air again through heat exchange.

In addition, in the case of the lower module, a forced cooling system is formed to forcedly suction outside air by installing a blower fan, and then dissipate the outside air through heat exchange.

In this regard, in the related art, as shown in FIG. 1, air introduced into the blower fan is dispersed toward a heat sink 60 side of an upper portion and a DC reactor 70 side of a lower portion, and forms two air flows, and then is collected into one again, and discharged through a discharge plate. This is to cool the heat sink 60 at the upper side and the DC reactor at the lower side simultaneously, considering a structure in which the heat sink and the DC reactor are disposed up and down.

However, when the heat sink and the DC reactor are disposed in a stacked arrangement in the vertical direction as in the related art, there is a disadvantage in that the concentration of heat dissipation is reduced as the air is branched, and the size H1 in the height direction of the lower module is larger. In addition, the extension length of the heat dissipation fin provided in the heat sink is limited, and thus there is a disadvantage in that the heat dissipation performance is limited. There is a need for development of a heat dissipation structure for improving the above problem.

SUMMARY

An embodiment of the present disclosure is directed to providing a lower module capable of improving heat dissipation performance by efficiently disposing components in the lower module of a power electronic device.

An embodiment of the present disclosure is directed to providing a lower module capable of minimizing a size.

According to an aspect of the present disclosure, there is provided a lower module included in a power electronic device divided into an upper module and a lower module by an intermediate plate, the lower module comprising: a blower fan installed on one side surface of the lower module to introduce air into an inner space of the lower module from the outside; a plurality of capacitors installed in a suspended form on the intermediate plate and spaced apart from the blower fan by a predetermined distance; a heat sink having a plurality of heat dissipation fins through which heat generated from a heating component disposed on the upper module is conducted, and disposed adjacent to the capacitors to cool the plurality of heat dissipation fins by air moved from the plurality of capacitors; a DC reactor disposed between one side surface of the lower module and the other side surface opposite thereto and cooled by the air moved from the heat dissipation fins; and a discharge plate disposed on the other side surface of the lower module and having a vent hole so as to discharge the air moved from the DC reactor to outside, wherein the air passes through the blower fan, the plurality of capacitors, the heat sink, the DC reactor, and the discharge plate, in order, to be then discharged to the outside after heat exchange.

In this case, at least a portion of the capacitor, the heat sink, and the DC reactor may be disposed to overlap with each other when viewed from one side surface or the other side surface of the lower module.

In this case, the DC reactor may be disposed not to deviate from the heat sink with respect to a height direction of the lower module.

In this case, the predetermined distance at which the plurality of capacitors are spaced apart from the blower fan may be within a thickness of the blower fan.

In this case, at least four of the plurality of capacitors may be spaced apart from each other along a width direction of the lower module, so that at least three air movement passages may be formed between the at least four capacitors.

In this case, the heat dissipation fin may extend to a position adjacent to a base surface of the lower module.

In this case, an end of the heat dissipation fin may be in contact with a base surface of the lower module, thereby allowing heat to be conducted from the heat dissipation fin to the base surface.

In this case, the plurality of heat dissipation fins may be disposed to be perpendicular to the discharge plate and parallel to each other, and have a thickness of at least 1 mm to be formed by an extrusion process.

In this case, the DC reactor may include a main body fixed to a base surface of the lower module; a connection line extending from the main body and connected to the upper module side; and a connection line housing having one end connected to the main body and the other end fixed to the intermediate plate or the upper module, and having a space through which the connection line passes inside to protect the connection line.

In this case, a fixing member detachably coupled to the intermediate plate or the electronic components included in the upper module may be provided at the other end of the connection line housing.

According to another aspect of the present disclosure, there is provided a lower module included in a power electronic device divided into an upper module and a lower module by an intermediate plate, the lower module comprising: a suction plate installed on one side surface of the lower module and having a vent hole through which air can be introduced air into an inner space of the lower module from the outside; a plurality of capacitors installed in a suspended form on the intermediate plate and spaced apart from the suction plate by a predetermined distance; a heat sink having a plurality of heat dissipation fins through which heat generated from a heating component disposed on the upper module is conducted, and disposed adjacent to the capacitors to cool the plurality of heat dissipation fins by air moved from the plurality of capacitors; a DC reactor disposed between one side of the lower module and the other side opposite thereto and cooled by the air moved from the heat dissipation fins; and a blower fan disposed on the other side surface of the lower module and discharging the air moved from the DC reactor to outside, wherein the air passes through the suction plate, the plurality of capacitors, the heat sink, the DC reactor, and the blower fan, in order, to be then discharged to the outside after heat exchange.

The lower module of the power electronic device according to an embodiment of the present disclosure can optimize heat dissipation performance by forming a straight air flow that is not branched by disposing the DC reactor at the rear side of the heat sink and reduce a separation distance from the blower fan to the capacitor.

The lower module of the power electronic device according to an embodiment of the present disclosure can extend the length of the heat dissipation fin to be sufficiently long by disposing the DC reactor at the rear side of the heat sink and improve the heat dissipation performance and reduce the length of the lower module in the height direction.

The lower module of the power electronic device according to an embodiment of the present disclosure can smoothly move air between the plurality of capacitors by disposing three or more miniaturized capacitors in the width direction.

The lower module of the power electronic device according to an embodiment of the present disclosure can include a connection line housing to stably protect the connection line of the DC reactor from external force.

Figure 1:
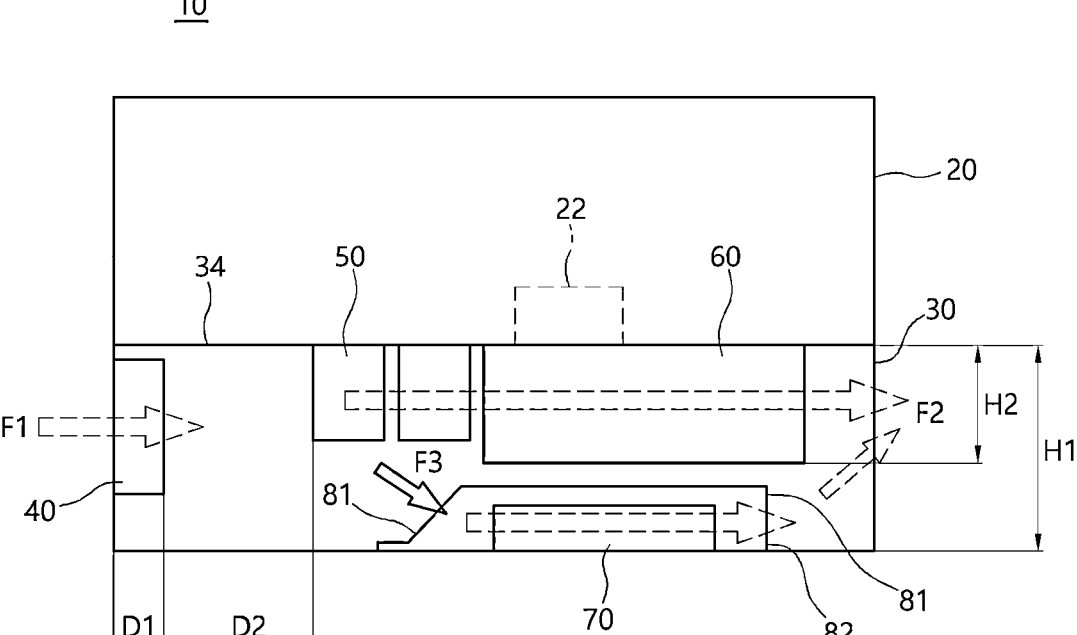
FIG. 1 is a cross-sectional view illustrating an upper module and a lower module of a power electronic device according to a related art.

4 including a lower module according to another embodiment of the present disclosure, together.

DETAILED DESCRIPTION

Hereinafter, exemplary embodiments of the present disclosure will be described in detail so that those of ordinary skill in the art can readily implement the present disclosure with reference to the accompanying drawings. The present disclosure may be embodied in many different forms and is not limited to the embodiments set forth herein. In the drawings, parts unrelated to the description are omitted for clarity of description of the present disclosure. Throughout the specification, like reference numerals denote like elements.

It is understood that the terms "comprise" or "have" when used in this specification, are intended to specify the presence of stated features, integers, steps, operations, members, components and/or a combination thereof but not preclude the possibility of the presence or addition of one or more other features, integers, steps, operations, members, components, or combinations thereof.

Figure 3:
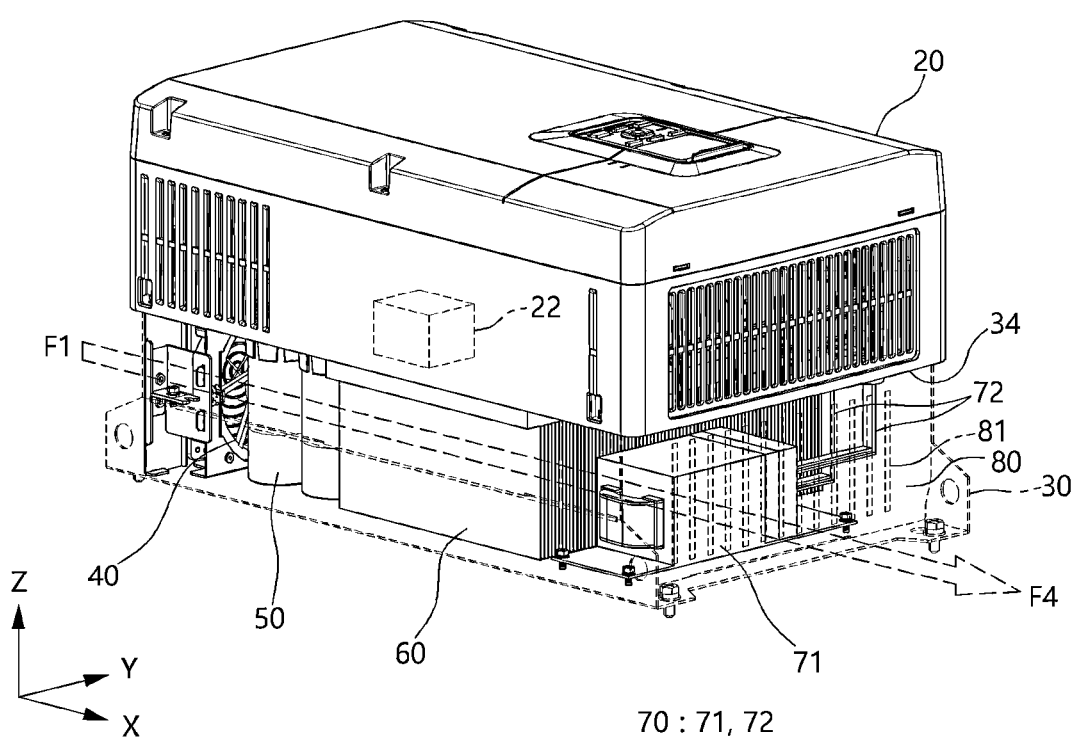
FIG. 3 is a perspective view of a power electronic device including a lower module according to an embodiment of the present disclosure, which is viewed from a discharge plate side.

In this specification, in defining the position between each component, based on the direction from the blower fan 40 toward the discharge plate 80, it is defined as being located on the front side as it is closer to the blower fan, and is defined as being located on the rear side as it is closer to the discharge plate. In addition, as shown in FIG. 3, the direction from the blower fan toward the discharge plate is defined in the longitudinal direction (x direction) of the lower module, the direction perpendicular to the longitudinal direction (y direction) is defined in the width direction of the lower module, and the direction perpendicular to the longitudinal direction and the width direction (z direction) is defined in the height direction.

Figure 2:
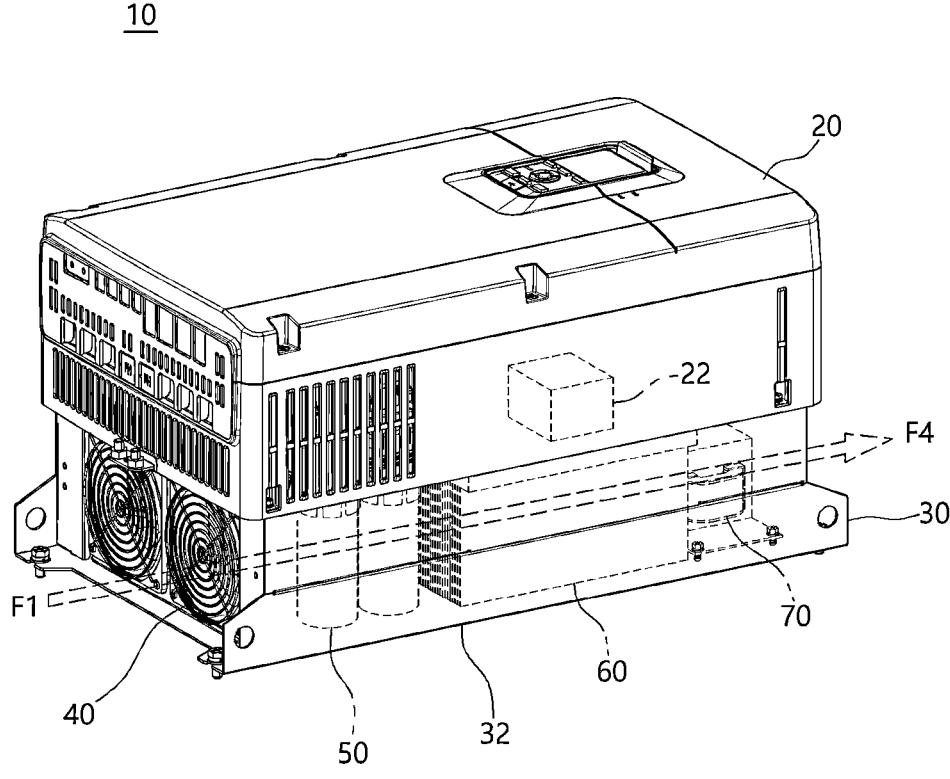
FIG. 2 is a perspective view of a power electronic device including a lower module according to an embodiment of the present disclosure, which is viewed from a blower fan side.
Figure 4:
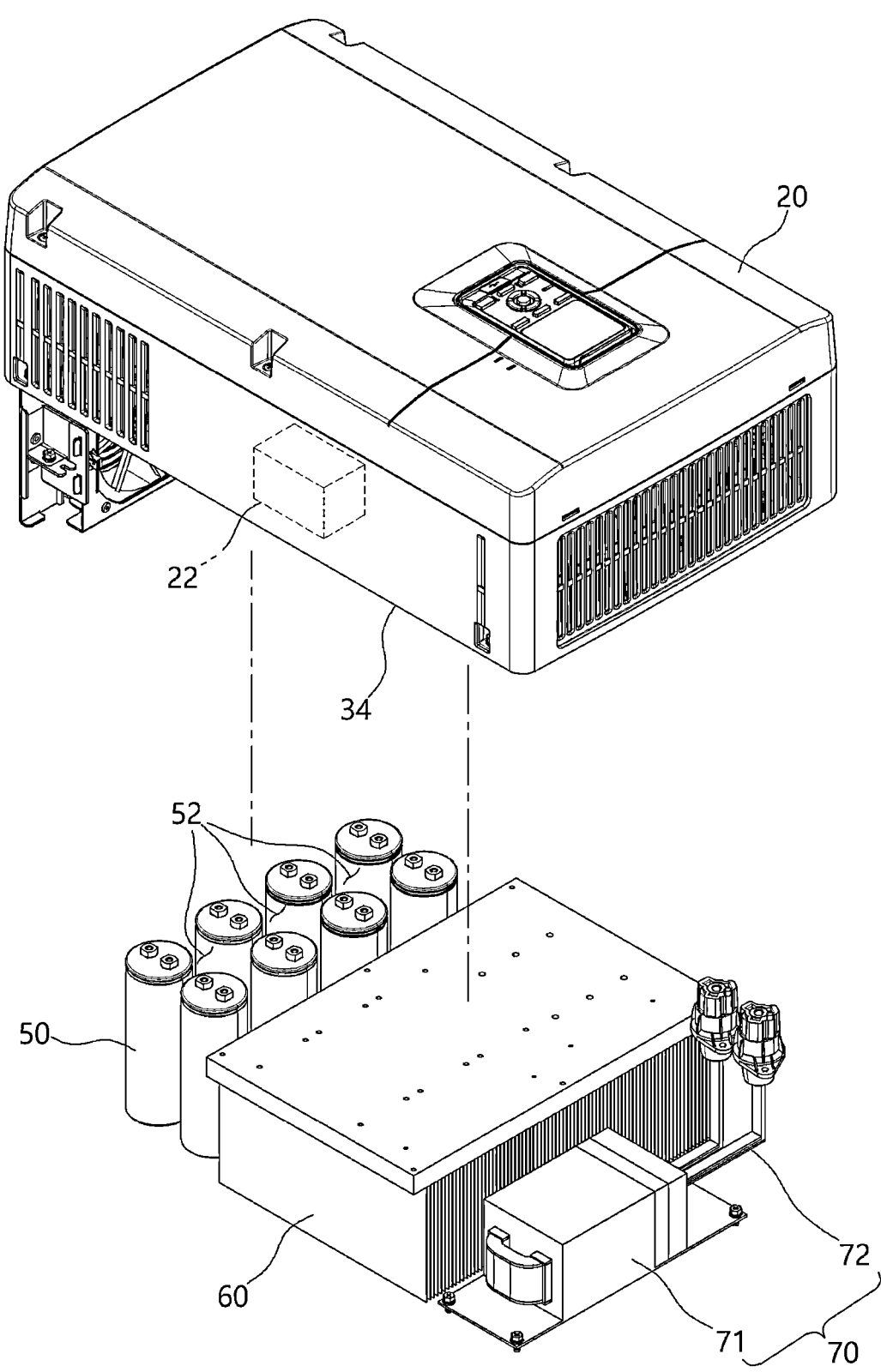
FIG. 4 is a perspective view of a separation illustrating an upper module and a lower module of a power electronic device including a lower module according to an embodiment of the present disclosure, separated from each other.
Figure 5:
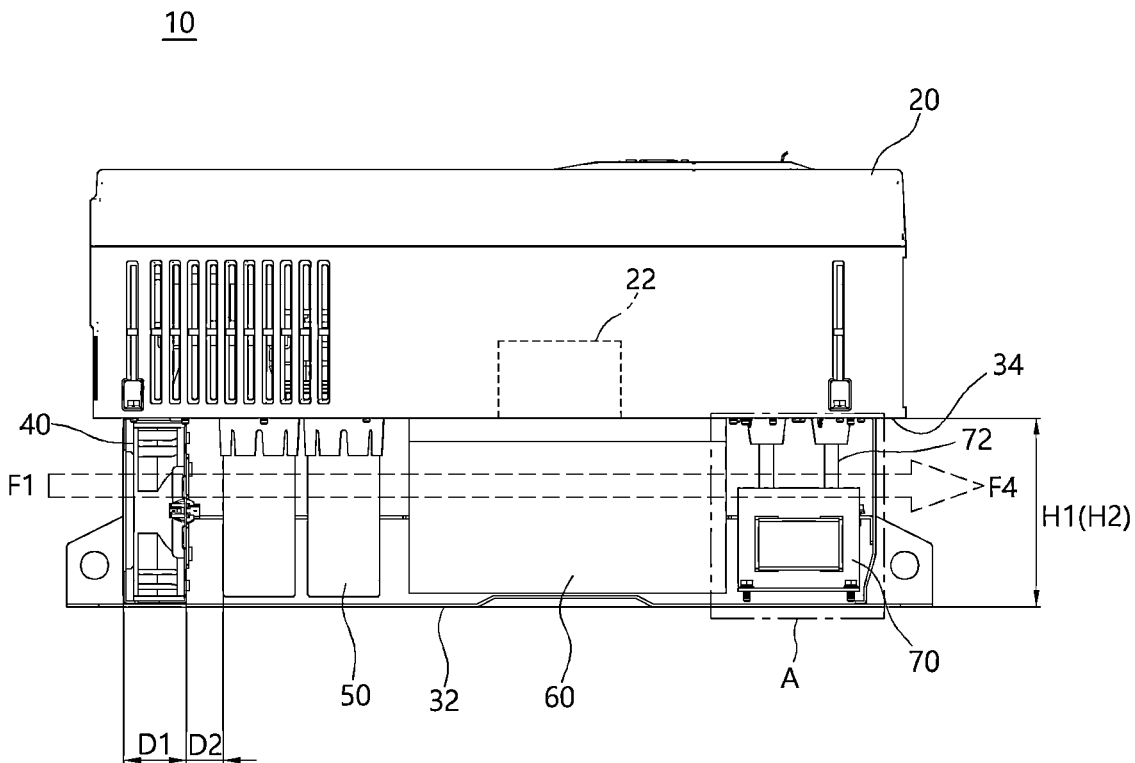
FIG. 5 is a cross-sectional view illustrating an upper module and a lower module of a power electronic device including a lower module according to an embodiment of the present disclosure, together.
Figure 6:
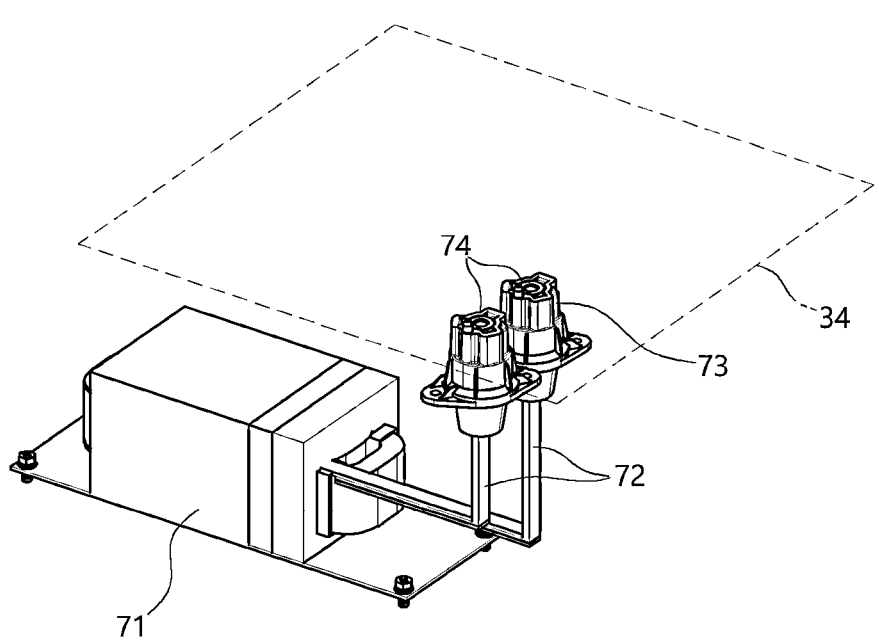
FIG. 6 is a perspective view illustrating a DC reactor of a lower module according to an embodiment of the present disclosure.
Figure 7:
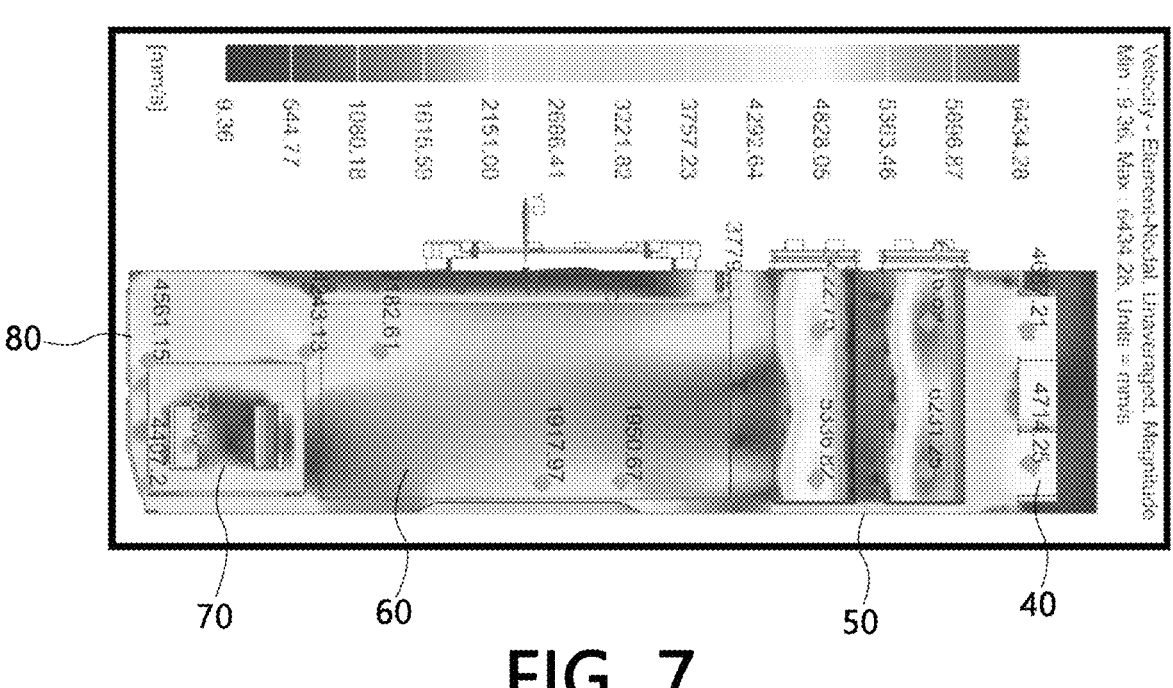
FIG. 7 is a thermal image for describing a heat dissipation effect of a lower module according to an embodiment of the present disclosure.

FIG. 1 is a cross-sectional view illustrating an upper module and a lower module of a power electronic device according to a related art. FIG. 2 is a perspective view of a power electronic device including a lower module according to an embodiment of the present disclosure, which is viewed from a blower fan side. FIG. 3 is a perspective view of a power electronic device including a lower module according to an embodiment of the present disclosure, which is viewed from a discharge plate side. FIG. 4 is a perspective view of a separation illustrating an upper module and a lower module of a power electronic device including a lower module according to an embodiment of the present disclosure, separated from each other. FIG. 5 is a cross-sectional view illustrating an upper module and a lower module of a power electronic device including a lower module according to an embodiment of the present disclosure, together. FIG. 6 is a perspective view illustrating a DC reactor of a lower module according to an embodiment of the present disclosure. FIG. 7 is a thermal image for describing a heat dissipation effect of a lower module according to an embodiment of the present disclosure.

The lower module of the power electronic device according to an embodiment of the present disclosure (hereinafter, referred to as "lower module") relates to a lower module 30 of a power electronic device divided into an upper module 20 and a lower module 30 based on an intermediate plate 34 as the power electronic device shown in FIGS. 1 and 2, and can obtain excellent heat dissipation effect and space saving effect by effectively arranging a configuration included in the lower module.

In this case, the lower module 30 according to an embodiment of the present disclosure may include a blower fan 40, a capacitor 50, a heat sink 60, and a DC reactor 70, and may be, for example, a lower module of an inverter device that converts DC power into AC power having a voltage and a frequency of a desired magnitude.

However, the application of the lower module according to an embodiment of the present disclosure is not limited to the inverter device, and it should be noted that it can be applied to any power electronic device including a blower fan 40, a capacitor 50, a heat sink 60, and a DC reactor 70. However, for convenience of description, the following description will be given assuming that the lower module according to an embodiment of the present disclosure is applied to the inverter device.

Referring to FIG. 2, the lower module 30 according to an embodiment of the present disclosure includes a blower fan 40 for introducing air from the outside into an inner space of the lower module 30.

In this case, the blower fan 40 may be a known axial flow type blower capable of introducing air in a direction parallel to a rotation axis by having an impeller rotating about the rotation axis.

In an embodiment of the present disclosure, the blower fan 40 may be disposed on one side surface of the lower module 30. Here, the one side surface of the lower module 30 may be one side surface of two side surfaces having a short length in the width direction among four side surfaces constituting the lower module 30 in the box shape.

In this case, as shown in FIG. 2, a plurality of blower fans 40 may be installed in parallel to the width direction of the one side surface.

Next, the lower module 30 according to an embodiment of the present disclosure includes a discharge plate 80 disposed on the other side surface facing the one side surface on which the blower fan 40 is installed.

In this case, the discharge plate 80 may be formed in a plate shape disposed to face the above-described blower fan 40, and may have a plurality of vent holes 81 therein so that air may be discharged to the outside of the lower module.

With the above-described blower fan 40 and the discharge plate 80, an air flow from a direction from F1 to F4 may be formed in one direction along the longitudinal direction of the lower module 30 in the inner space of the lower module 30.

In an embodiment of the present disclosure, in order to obtain the above-described heat dissipation effect and space utilization effect, a capacitor 50, a heat sink 60, and a DC reactor 70 may be efficiently disposed in the inner space of the lower module 30 existing between the blower fan 40 and the discharge plate 80.

First, the capacitor 50 may be disposed at a position closest to the blower fan 40.

In this case, the capacitor 50 may be disposed to be spaced apart from the blower fan 40 by a predetermined distance D2 to secure a space in which air introduced from the blower fan 40 may move straightly along the longitudinal direction of the lower module 30 by a predetermined distance D2. This is to prevent a significant number of vortexes from being generated before the air flow in one direction is induced when the capacitor 50 is disposed in close contact with the blower fan 40.

However, as the separation distance D2 between the blower fan 40 and the capacitor 50 increases, the volume of the power electronic device also increases. However, in the case of the lower module 30 according to an embodiment of the present disclosure, as shown in FIG. 5, the separation distance D2 may be within the maximum thickness D1 of the blower fan 40. In the case of the related art, as seen in FIG.

1, compared to requiring a separation distance D2 three to four times the length D1 of the blower fan 40, in the case of the lower module 30 according to an embodiment of the present disclosure, it is possible to achieve a significant space reduction.

As such, that the lower module 30 according to an embodiment of the present disclosure may reduce the separation distance D2 between the blower fan 40 and the capacitor 50 is possible due to efficient arrangement between the capacitor 50 and the heat sink 60 and DC reactor 70 to be described later. This will be described in more detail after completing the overall description of each component.

In an embodiment of the present disclosure, the number of capacitors 50 installed in a suspended form on the intermediate plate 34 may be plural.

As a specific example, referring to FIG. 4, at least four capacitors 50 may be disposed to be spaced apart from each other along the width direction of the lower module 30. In this case, at least three air movement passages 52 may be formed between the capacitors 50 spaced apart from each other, and the air moved from the blower fan 40 through the air movement passages 52 may be moved to the heat sink 60 at the rear side. In addition, the capacitor 50 may be cooled by heat exchange between the air moved through the air movement passages 52 and the capacitor 50.

As such, in order to arrange at least four capacitors 50, the lower module 30 according to an embodiment of the present disclosure may be miniaturized by having a plurality of small-capacity capacitors with a small diameter instead of conventional large-capacity capacitors. Through this, by securing the plurality of air movement passages 52, a stable straight movement space of air may be secured, and the contact area of the capacitor 50 may be increased to improve heat exchange. In addition, since the plurality of air movement passages 52 through which air may move straight comes adjacent to the blower fan 40, vortex generation may be suppressed. Through this, there is an effect of reducing the separation distance D2 between the blower fan 40 and the capacitor 50.

In an embodiment of the present disclosure, the heat sink 60 is arranged at the rear side of the capacitor 50.

In this case, one side of the heat sink 60 may pass through the intermediate plate 34 and be connected to the heating component 22 installed in the upper module 20. In this case, the heat sink 60 may be connected to the heating component 22 so that heat generated from the heating component 22 may conduct. In addition, a plurality of heat dissipation fins 61 through which, after the heat is conducted, the heat can be discharged through heat exchange with air may be provided on the other side of the heat sink 60.

In this case, referring back to FIG. 4 again, the plurality of heat dissipation fins 61 may be spaced apart from each other so as to be perpendicular to the blower fan 40 or the discharge plate 80 and parallel to each other.

In this case, air passing through the capacitor 50 arranged at the front side of the heat dissipation fin 61 may flow toward the DC reactor 70 at the rear side through a space formed between the individual heat dissipation fins spaced apart from each other. Here, of course, the air flowing between the heat dissipation fins 61 may be heat exchanged with the heat dissipation fins 61 to cool the heat dissipation fins 61.

In an embodiment of the present disclosure, referring back to FIG. 5 again, one end of the heat dissipation fin 61 may extend to a position adjacent to a base surface 32 of the lower module. Therefore, the length of the heat dissipation fin 61 may be sufficiently extended.

Meanwhile, since only a space with a minute gap exists between the lower end of the heat dissipation fin 61 and the base surface 32, other components cannot be disposed between the heat dissipation fin 61 and the base surface 32.

On the other hand, referring back to FIG. 1 again, in the case of the related art, another component such as the DC reactor 70 is disposed between the heat dissipation fin 61 and the base surface 32. This is to cool the inside of the lower module 30 by diverting air into two air streams including an air flow F2 for cooling the heat sink 60 disposed at an upper side and an air flow F3 for cooling the DC reactor 70 disposed at a lower side, as described in relation to the background art.

In this case, the height H2 of the heat dissipation fin may be significantly less than the height H1 of the lower module. That is, the height H2 of the heat dissipation fin may be limited by the DC reactor 70 at the lower side.

However, the lower module 30 according to an embodiment of the present disclosure may be characterized in that the DC reactor 70 to be described later is disposed at the rear side, not at the lower side of the heat sink 60, so that the air F1 introduced from the blower fan 40 is not diverged, and one air flow F4 is formed and discharged along the longitudinal direction of the lower module 30.

As such, by disposing the DC reactor 70 at the rear side of the heat sink 60, the lower module according to an embodiment of the present disclosure may be disposed such that at least a portion of the capacitor 50, the heat sink 60, and the DC reactor 70 overlap with each other when viewed from one side surface or the other side surface of the lower module 30. That is, at least a portion of the capacitor 50, the heat sink 60, and the DC reactor 70 may be disposed to overlap with each other when viewed from one side surface or the other side surface of the lower module 30.

As such, the height direction lengths of the heat sink 60 and the DC reactor 70 overlap with each other, the lower module according to an embodiment of the present disclosure may minimize the height direction length. This may result in a reduction in the overall size of the power electronic device, and thus may improve space utilization due to mounting of the power electronic device.

As a more specific example, in order to extremely minimize the height direction length H1 of the lower module, the DC reactor 70 may be disposed not to deviate from the heat sink 60 disposed at the front side with respect to a height direction of the lower module 30 as shown in FIG. 5.

Meanwhile, in an embodiment of the present disclosure, one end of the heat dissipation fin 61 may extend to be in direct contact with the base surface 32 of the lower module. That is, as shown in FIG. 5, the height H2 of the heat dissipation fin may extend to be close to the height H1 of the lower module. Of course, this is also possible because the DC reactor 70 is not disposed between the heat dissipation fin 61 and the base surface 32.

In this case, the base surface 32 may be formed of a material having excellent thermal conductivity, similar to the heat dissipation fin 61. Therefore, when the heat dissipation fin 61 is in contact with the base surface 32, heat conduction may be performed from the heat dissipation fin 61 to the base surface 32, and thus the cooling of the heat dissipation fin 61 may be easily performed. In addition, as the heat dissipation fin 61 is cooled by the base surface 32, the amount of heat exchange between the heat dissipation fin 61 and the air may be relatively reduced, and as a result, the temperature of the air present in the lower module 30 may be kept lower. As such, the air at the lower temperature may further improve the cooling efficiency of other components in the lower module 30, for example, the DC reactor 70 present on the rear side.

Meanwhile, in an embodiment of the present disclosure, the heat dissipation fin 61 of the heat sink 60 may have a thickness of at least 1 mm or more. Specifically, the heat dissipation fin 61 applied to the lower module 30 according to an embodiment of the present disclosure may have a sufficiently thick thickness so as to be formed not only by the press-in process but also by the extrusion process. This is because the heat dissipation fin 61 may be extended sufficiently long to be adjacent to or in contact with the base surface 32 of the lower module 30 by the lower module 30 according to an embodiment of the present disclosure, and thus a sufficient heat dissipation performance may be secured even if the thickness of the heat dissipation fin 61 is not formed to be thin as in the related art.

In an embodiment of the present disclosure, a DC reactor is disposed in the rear side of the heat sink 60, that is, in a space formed between the heat sink 60 and the discharge plate 80. Here, the DC reactor 70 is a known electronic component installed in a D.C link to reduce harmonics included in the power current, and may refer to a conventional DC reactor 70 capable of low-smoothing harmonics by gradual changes in current through a current-limiting action.

The lower module 30 according to an embodiment of the present disclosure disposes the DC reactor 70 at the rear side, rather than the lower side of the heat sink 60, in order to reduce the height direction length H1 of the lower module 30 and unify the flow of air in the lower module 30 into one large flow as described above.

In this case, referring to FIG. 6, the DC reactor 70 includes a main body 71 and a connection line 74 extending from the main body 71 and connected to the upper module 20 side.

In an embodiment of the present disclosure, the DC reactor 70 may further include a connection line housing 72 disposed to surround the connection line so that the connection line is not exposed to the outside in order to protect the connection line from the external force.

Specifically, as shown in the drawings, one end of the connection line housing 72 may be connected to the main body 71 and the other end may be fixed to the intermediate plate 34 above. In addition, the connection line housing 72 may prevent the connection line inside from moving by the external force by maintaining a fixed external shape.

In contrast, in the related art, as the DC reactor 70 is disposed below the heat sink 60, the connection line connected to the upper module 20 present above the heat sink 60 may be exposed to the outside without a separate protective member. This is because, as in an embodiment of the present disclosure, the heat sink 60 is present above the DC reactor 70, a sufficient space for disposing the connection line housing 72 protecting the connection line may not be provided.

In an embodiment of the present disclosure, a separate fixing member 73 detachably coupled to the intermediate plate 34 or the electronic components (not shown) included in the upper module 20 may be provided at the other end of the connection line housing 72 fixed to the intermediate plate 34. Through this, the DC reactor 70 may be separated from or coupled to the intermediate plate 34 or the upper module 20 as necessary.

Meanwhile, as shown in FIG. 6, the main body 71 of the DC reactor 70 may be fixed to the base surface of the lower module 30 via a fixing bolt disposed at the lower side so as to be separable from the lower module 30 as necessary.

Hereinafter, the flow and effect of air formed in the inner space of the lower module 30 by the lower module 30 according to an embodiment of the present disclosure will be described in detail.

Referring back to FIG. 5, in an embodiment of the present disclosure, air is introduced into the blower fan 40, passes through a space formed between the heat dissipation fins 61 of the heat sink 60 through the air movement passage 52 formed between the plurality of capacitors 50, passes through the DC reactor 70 at the rear side, and then finally is discharged to the outside through the discharge plate 80. That is, air forms a straight flow F4 that passes in the order of the blower fan 40—capacitor 50—heat sink 60—DC reactor—discharge plate, thereby effectively cooling the capacitor 50, heat sink 60, and DC reactor 70. This is clearly contrasted with the related art air flow forming two alternating air flows in the upper and lower portions, as previously described.

As such, the lower module 30 according to an embodiment of the present disclosure has many advantages in terms of heat dissipation effect and space utilization by forming a straight air flow that is not branched.

First, a single air flow is formed, so that a sufficient amount of air can effectively cool each component including the heat dissipation fin 61 and the DC reactor 70. In addition, since the heat dissipation fin 61 may be extended long to be adjacent to the base surface of the lower module 30 by disposing the DC reactor 70 on the rear side of the heat sink 60, the heat dissipation effect by the heat dissipation fin 61 may be maximized. And, when the heat dissipation fin 61 is formed to be in contact with the base surface 32 of the lower module 30, a heat dissipation effect by the base surface 32 may be obtained.

Such a heat dissipation effect of the lower module 30 according to an embodiment of the present disclosure is clearly confirmed through the thermal image of FIG. 7. That is, the maximum temperature in the lower module 30 is only 75 degrees, so that it satisfies the allowable heat resistance temperature of 100 degrees for power electronic devices with a margin.

In the case of the related art, since the air flow needs to be formed in two branches, it is necessary to secure a sufficient linear flow distance between the blower fan 40 and the capacitor 50 before the air is branched. However, in the case of the lower module according to an embodiment of the present disclosure, since the air does not need branching, the linear flow distance D2 may be shortened, and as a result, there is an advantage in that the length of the lower module 30 in the longitudinal direction may be reduced.

Further, the heat sink 60 and the DC reactor 70 are not vertically stacked, but are arranged horizontally along each other, thereby reducing the height direction length of the lower module 30. Further, since the thickness of the heat dissipation fin 61 may be relatively thick, there is an advantage in the process related to the manufacturing of the heat dissipation fin 61.

Figure 8:
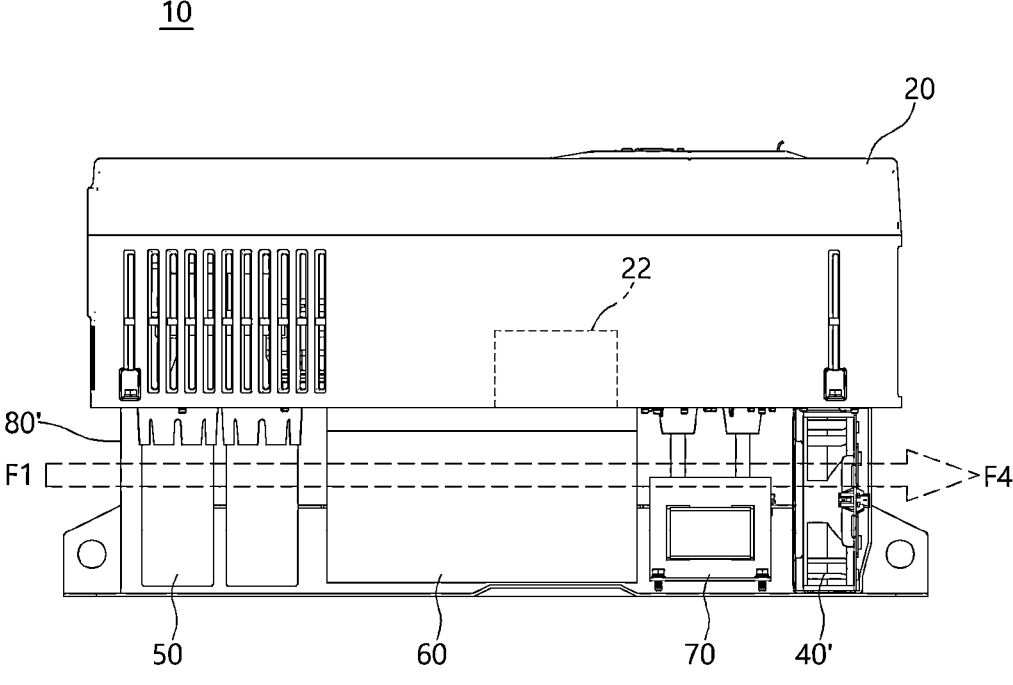
FIG. 8 is a cross-sectional view illustrating an upper module and a lower module of a power electronic device

FIG. 8 is a cross-sectional view illustrating an upper module and a lower module of a power electronic device including a lower module according to another embodiment of the present disclosure, together. Hereinafter, another embodiment of the present disclosure will be described with reference to FIG. 8.

The lower module 30' according to another embodiment of the present disclosure may include a suction plate 80' disposed at a front side of the capacitor, and a blower fan 40' disposed at a rear side of the DC reactor 70. In this case, the positional relationship between the capacitor 50, the heat sink 60, and the DC reactor 70 is the same as the above-described embodiment.

In this case, the suction plate 80' may be disposed at one side of the lower module 30' as shown in the drawings, and may include a plurality of vent holes through which air may flow, similar to the discharge plate 80. In addition, the blower fan 40' may be disposed at the other side of the lower module so as to face the suction plate 80', and may be an axial flow type blower for allowing air to flow in one direction, similar to the above-described embodiment. That is, only the positional relationship is reversed compared to the above-described embodiment, and the suction plate 80' and the blower fan 40' perform the same functions as the discharge plate 80 and the blower fan included in the above-described embodiment.

Referring back to FIG. 8, looking at the air flow in the lower module 30' according to another embodiment of the present disclosure, air may flow through the suction plate 80' and then flow by the blower fan 40' to pass through in the order of the plurality of capacitors 50, the heat sink 60, and the DC reactor 70, and exchange heat, and then finally may be discharged to the outside of the lower module 30' through the blower fan 40'.

Through this, a single type of air flow may be formed, and various effects obtained by arranging the DC reactor 70 in a lateral direction parallel to the heat sink are the same as the above-described embodiment, and thus redundant descriptions are avoided.

Although exemplary embodiments of the present disclosure have been described above, the idea of the present disclosure is not limited to the embodiments set forth herein. Those of ordinary skill in the art who understand the idea of the present disclosure may easily propose other embodiments through supplement, change, removal, addition, etc. of elements within the scope of the same idea, but the embodiments will be also within the scope of the present disclosure.

What is claimed is:

1. A lower module included in a power electronic device divided into an upper module and a lower module by an intermediate plate, the lower module comprising:

a blower fan installed on a first side surface of the lower module to introduce air into an inner space of the lower module from outside of the lower module;

a plurality of capacitors installed in a suspended form on the intermediate plate and spaced apart from the blower fan by a predetermined distance;

a heat sink having a plurality of heat dissipation fins through which heat generated from a heating component disposed on the upper module is conducted, and disposed adjacent to the plurality of capacitors to cool the plurality of heat dissipation fins by air moved from the plurality of capacitors;

a Direct Current (DC) reactor disposed between a first side of the lower module and a second side opposite to the first side and cooled by the air moved from the plurality of heat dissipation fins; and a discharge plate disposed on a second side surface of the lower module and having a vent hole so as to discharge the air moved from the DC reactor to outside, wherein the air passes through the blower fan, the plurality of capacitors, the heat sink, the DC reactor, and the discharge plate, in order, to be then discharged to the outside after heat exchange, wherein an end of a heat dissipation fin of the plurality of heat dissipation fins is in contact with a base surface of the lower module, thereby allowing heat to be conducted from the heat dissipation fin to the base surface.

2. The lower module of a power electronic device of claim 1, wherein at least a portion of a capacitor of the plurality of capacitors, the heat sink, and the DC reactor are disposed to overlap with each other when viewed from the first side surface or the second side surface of the lower module.

3. The lower module of a power electronic device of claim 2, wherein the DC reactor is disposed not to deviate from the heat sink with respect to a height direction of the lower module.

4. The lower module of a power electronic device of claim 1, wherein the predetermined distance at which capacitors of the plurality of capacitors are spaced apart from the blower fan is within a thickness of the blower fan.

5. The lower module of the power electronic device of claim 1, wherein at least four capacitors of the plurality of capacitors are spaced apart from each other along a width direction of the lower module, so that at least three air movement passages are formed between the at least four capacitors.

6. The lower module of the power electronic device of claim 1, wherein the heat dissipation fin extends to a position adjacent to a base surface of the lower module.

7. The lower module of the power electronic device of claim 6, wherein the plurality of heat dissipation fins are disposed to be perpendicular to the discharge plate and parallel to each other, and have a thickness of at least 1 mm to be formed by an extrusion process.

8. The lower module of the power electronic device of claim 1, wherein the DC reactor comprises:
a main body fixed to a base surface of the lower module;
a connection line extending from the main body and connected to a side of the upper module; and
a connection line housing having a first end connected to the main body and a second end fixed to the intermediate plate or the upper module, and having a space through which the connection line passes inside to protect the connection line.

9. The lower module of the power electronic device of claim 8, wherein a fixing member detachably coupled to the intermediate plate or electronic components included in the upper module is provided at the second end of the connection line housing.

10. A lower module included in a power electronic device divided into an upper module and a lower module by an intermediate plate, the lower module comprising:
a blower fan installed on a first side surface of the lower module to introduce air into an inner space of the lower module from outside of the lower module;
a plurality of capacitors installed in a suspended form on the intermediate plate and spaced apart from the blower fan by a predetermined distance;
a heat sink having a plurality of heat dissipation fins through which heat generated from a heating component disposed on the upper module is conducted, and disposed adjacent to the plurality of capacitors to cool the plurality of heat dissipation fins by air moved from the plurality of capacitors;
a Direct Current (DC) reactor disposed between a first side of the lower module and a second side opposite to the first side and cooled by the air moved from the plurality of heat dissipation fins; and
a discharge plate disposed on a second side surface of the lower module and having a vent hole so as to discharge the air moved from the DC reactor to outside,
wherein the air passes through the blower fan, the plurality of capacitors, the heat sink, the DC reactor, and the discharge plate, in order, to be then discharged to the outside after heat exchange,
wherein at least four capacitors of the plurality of capacitors are spaced apart from each other along a width direction of the lower module, so that at least three air movement passages are formed between the at least four capacitors.

11. A lower module included in a power electronic device divided into an upper module and a lower module by an intermediate plate, the lower module comprising:
a blower fan installed on a first side surface of the lower module to introduce air into an inner space of the lower module from outside of the lower module;
a plurality of capacitors installed in a suspended form on the intermediate plate and spaced apart from the blower fan by a predetermined distance;
a heat sink having a plurality of heat dissipation fins through which heat generated from a heating component disposed on the upper module is conducted, and disposed adjacent to the plurality of capacitors to cool the plurality of heat dissipation fins by air moved from the plurality of capacitors;
a Direct Current (DC) reactor disposed between a first side of the lower module and a second side opposite to the first side and cooled by the air moved from the plurality of heat dissipation fins; and
a discharge plate disposed on a second side surface of the lower module and having a vent hole so as to discharge the air moved from the DC reactor to outside,
wherein the air passes through the blower fan, the plurality of capacitors, the heat sink, the DC reactor, and the discharge plate, in order, to be then discharged to the outside after heat exchange,
wherein the DC reactor comprises:
a main body fixed to a base surface of the lower module;
a connection line extending from the main body and connected to a side of the upper module; and
a connection line housing having a first end connected to the main body and a second end fixed to the intermediate plate or the upper module, and having a space through which the connection line passes inside to protect the connection line.

* * * * *